March 16, 1965 J. P. STELMAK 3,174,112

SEMICONDUCTOR DEVICES PROVIDING THE FUNCTIONS OF A PLURALITY OF CONVENTIONAL COMPONENTS

Filed July 29, 1960 2 Sheets-Sheet 1

WITNESSES:
Bernard R. Giegucy
Gordon H. Telfer

INVENTOR
John P. Stelmak
BY Charles F. Renz
ATTORNEY 3,174,112

SEMICONDUCTOR DEVICES PROVIDING THE FUNCTIONS OF A PLURALITY OF CONVENTIONAL COMPONENTS

John P. Stelmak, Greensburg, Pa., assignor to Westinghouse Electric Corporation, Pittsburgh, Pa., a corporation of Pennsylvania Filed July 29, 1960, Ser. No. 46,238
5 Claims. (Cl. 330—37)

This invention relates generally to semiconductor devices and, more particularly, to monolithic semiconductor devices wherein the functional equivalent of an entire circuit of conventional components is contained in a unitary body of semiconductor material. In addition, this invention relates to audio and video amplifiers embodied in semiconductor devices of the monolithic type.

Semiconductor devices which are the functional equivalent of an entire circuit of conventional components have aroused great interest in electronics because of the desire to provide electronic devices of decreased size and cost and increased reliability.

A monolithic semiconductor device generally comprises within the unitary body a plurality of portions which may be distinguished from each other by reason of their differing conductivity type or impurity concentration. These various portions, which are all part of a single physical unit, cooperate with each other to form a plurality of functional regions. Each functional region is the functional equivalent of a single conventional element or, possibly, of a group of interconnected conventional elements. By the expression "conventional elements" is meant, for example, transistors, diodes, resistors, capacitors, and other individual components which are usually joined together by the soldering of leads or the like to form the desired circuit configuration. By the term "functional equivalent" it is meant that a given electrical input results in substantially the same electrical output.

The functional regions of the unitary body are directly interconnected through the unitary body to all of the other functional regions of the device while in a conventional circuit, of course, each element is directly connected only to certain other elements between which some charge transfer or other interaction is desired. Therefore, proper functioning of the monolithic semiconductor device depends upon a selective interaction between the various functional regions. That is, while all the functional regions are within a single physical unit, it is desirable that their electrical interaction occur only in a selected pattern.

In order to reduce undesirable interaction in some prior monolithic semiconductor devices it was sometimes necessary to space the functional regions very far apart. An alternative was to take all the interactions into account in designing the device so that the total functional operation was that desired. Such an approach, when the number of possible interactions is large, creates design problems of great complexity which essentially exclude the making of many conceivable devices. Any solution to the problem of undesired interaction between functional regions should not complicate the method of manufacturing a monolithic semiconductor device.

Typical of the situations in which the physical unity of a monolithic semiconductor device causes problems of undesired interaction is that in which the object is to provide the functional equivalent of a multi-stage amplifier in a unitary block. Such devices are obviously of great importance in the communication field for example.

It is, therefore, an object of the present invention to provide monolithic semiconductor devices wherein interaction between functional regions occurs only in a selected pattern.

Another object is to provide monolithic semiconductor devices which include within a single block of material the functional equivalent of an entire multistage amplifier circuit which circuit may also include means to tune the amplifier.

Another object is to provide a method of forming monolithic semiconductor devices which have substantially isolated functional regions wherever desired.

According to the present invention, monolithic semiconductor devices are provided wherein high resistivity, or intrinsically conductive, semiconductor material is used in order to provide substantial isolation wherever desired between the various functional regions of the device. By high resistivity is meant a resistivity of at least 50 ohm-centimeters and preferably from about 100 ohm-centimeters to about 200 ohm-centimeters. According to a further feature, monolithic semiconductor devices are provided with a thin layer of high resistivity semiconductor material which permits carrier conduction transversely therethrough but substantially prevents lateral conduction, thereby limiting the interactions which must be taken into account in designing the device.

According to another feature of the present invention, monolithic semiconductor devices are provided which are the functional equivalent of audio or video amplifiers by reason of the proper formation of portions of the unitary semiconductive body to cooperate as functional equivalents of conventional circuit elements.

According to another feature of the invention, the monolithic amplifier devices include means to make them tunable over a range of frequencies.

According to another feature of the invention, methods are provided by which monolithic semiconductor devices may be formed by performing operations on a single wafer of high resistivity, or intrinsically conductive, semiconductor material.

The features of the present invention which are believed to be novel are set forth with particularity in the appended claims. The present invention, both as to its organization and manner of operation, together with the above-mentioned and further objects and advantages thereof, may best be understood by reference to the following description, taken in connection with the accompanying drawings, in which:

Figures 1, 2:
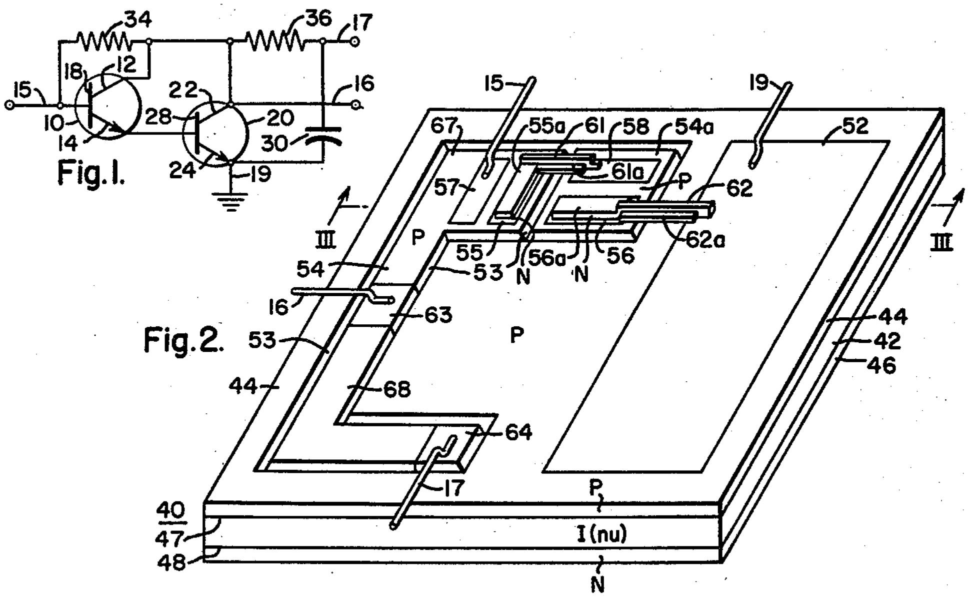
FIG. 1 is a circuit schematic of the circuit equivalent of one emibodiment of a device in accordance with the present invention.
FIG. 2 is a top view in perspective of a device in accordance with the present invention embodying the circuit of FIG. 1.

FIG. 1 shows the equivalent circuit of a two stage amplifier which is sometimes known as the Darlington connection and some of the basic features of which are disclosed in U.S. Patent 2,663,806. This circuit is presented as being merely representative of the type of circuit which may be embodied in monolithic semiconductor devices in the practice of applicant's invention. The circuit comprises first and second transistors 10 and 20 of like conductivity, here shown as being npn. The collectors 12 and 22 of the transistors are at a common potential while the emitter 24 of the second transistor 20 is connected to ground. The emitter 14 of the first transistor 10 is connected to the base 28 of the second transistor 20. An input lead 15 is connected to the base 18 of the first transistor 10. An output lead 16 is connected to the collector 22 of the second transistor 20. A first resistor 34 is provided across the base 18 and collector 12 of the first transistor 10. A by-pass capacitor 30 and a second resistor 36 are provided in series across the emitter 24 and collector 22 of the second transistor 20. For discussion of some advantages and the operation of this circuit, reference should be made to the above-mentioned U.S. patent.

It will be obvious to those skilled in the art that the practice of the present invention is not limited to the circuit shown in FIG. 1. Other circuits with which the present invention may be practiced include any of the known transistor amplifier circuits. Such circuits are shown in the above-mentioned U.S. patent and also on pages 11–25 of Handbook of Semiconductor Electronics, edited by Lloyd P. Hunter, first edition, McGraw-Hill Book Company, 1956. While particularly directed to amplifier circuits, it will also be observed that the teachings of this invention are applicable to other circuits such as switching circuits, oscillator and multivibrator circuits and others employed in the electronic art which presently use individual semiconductor elements coupled together by ordinary conductive leads. Broadly, the present invention can be practiced to great advantage wherever it is desired to provide a monolithic semiconductor device with only selected interaction between functional regions.

Figure 3:
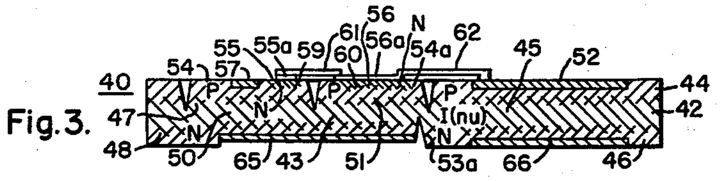
FIG. 3 is a cross sectional view taken along line III—III in FIG. 2.
Figure 4:
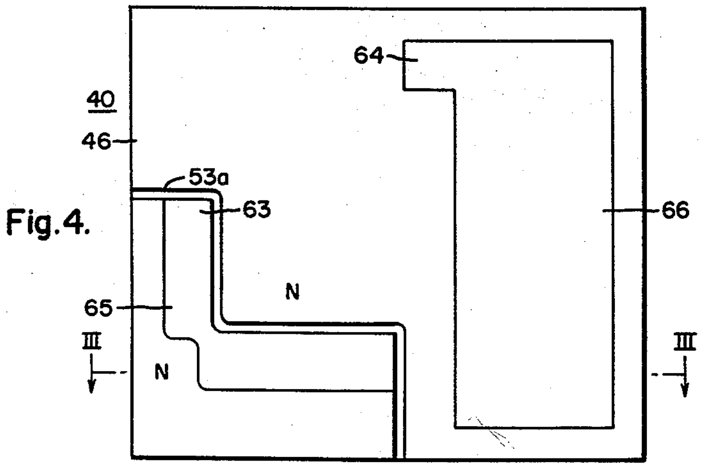
FIG. 4 is a bottom view of the device of FIGS. 2 and 3.

Referring now to FIGS. 2–4 there is shown a unitary block of semiconductor material 40 which functionally provides the equivalent of the circuit shown in FIG. 1. The unitary block 40 comprises a plurality of regions of different characteristics which may be formed therein by alloying or diffusion techniques. The different regions or portions of the unitary block 40 are not shown to scale; all dimensions are greatly exaggerated but not by the same factor. This semiconductor block 40 has a center region 42 of a high resistivity or intrinsically conductive, semi-conductor material such as silicon having a resistivity of at least 50 ohm-cm. and preferably of from 100 to 200 ohm-cm. A p-type layer 44 and an n-type layer 46 of lower resistivity are situated in contact with the high resistivity layer 42 on the top and bottom surfaces respectively. The layers 44 and 46 may be of the same material as that used for layer 42 but with suitable doping impurities.

Other semiconductive materials besides silicon may be used for the high resistivity layer 42 if they can be obtained in sufficiently high resistivity. These other materials include germanium, silicon carbide and the III–V compounds. The high resistivity layer 42 may either be such that the predominating impurities therein are of the doner type or the acceptor type. In the former case the layer is slightly n-type and is referred to as having nu-type conductivity. In the latter case, the layer is slightly p-type and is referred to as having pi-type conductivity. These designations, nu and pi, distinguish a high resistivity material from low resistivity n- and p-type. The latter materials have impurity concentrations of greater than about $10^{16}$ atoms per cubic centimeter. The high resistivity material has an impurity concentration of only about $10^{14}$ atoms per cubic centimeter.

In the ensuing discussion it is assumed that the high resistivity layer 42 is of nu-type conductivity. It will be understood that the conductivity of all the various regions may be reversed without impairing operation of the device. Therefore, as thus far described, the unitary block 40 is of three layers including a high resistivity layer 42 of nu-type conductivity in the center with a p-type layer 44 on top, an n-type layer on the bottom of the high resistivity layer 42. The p-type and n-type layers 44 and 46 are in direct contact with the high resistivity layer 42. The p-type layer 44 will form a rectifying junction 47 at the interface between it and the nu-type high resistivity layer 42. The barrier 48 between the nu-type region and the n-type region is essentially ohmic because the layers 42 and 46 are of like conductivity type.

The structural details shown in FIGS. 2–4 are those resulting from the formation of the various portions of the device by vapor diffusion techniques. Minor differences will occur if the device is made by a process which includes alloying of foils to the semiconductor wafer. These differences will become more apparent from the discussion of the two principal methods hereinafter.

The p-type layer 44 on the top surface is then subjected to various processing steps resulting in the formation of various geometrical portions. A substantial part of the top layer 44 has an ohmic metallized portion 52 formed thereon. Two additional portions 54 and 54*a* of the top layer 44 are separated from the remainder of the layer by cuts or grooves 53 which extend through the p-type layer 44 into the nu-type layer 42.

The portion 54 has an n-type portion 55 and an ohmic contact thereon. The portion 54*a* has an n-type portion 56 and an ohmic contact 58 thereon. The n-type portions 55 and 56 are formed by introducing n-type impurities into the p-type layer 44 resulting in the formation of p-n junctions 59 and 60 between layer 44 and the portions 55 and 56, respectively. Ohmic contacts 55*a* and 56*a* are disposed on the n-type portions 55 and 56, respectively. A conductive connection 61 is made between the first emitter contact 55*a* and the ohmic contact 58 and another conductive connection 62 is made between the second emitter contact 56*a* and the ohmic contact 52. Insulating films 61*a* and 62*a* insulate the conductors 61 and 62, respectively from the p-type layer 44. A pair of through-contacts 63 and 64 are also provided within the region 54 of the top layer 44. The through-contacts 63 and 64 are low resistance regions extending transversely entirely through the unitary block 40. Each of the through-contacts 63 and 64 may comprise discrete regions on each side of the block 40. The important thing is that the resistance from top to bottom is only a few ohms.

Four conductive leads 15, 16, 17 and 19 extend from the block 40 and serve as the only external connections to the device. Lead 15 is attached to the ohmic contact 57, lead 16 is attached to the top of the through-contact 63, lead 17 is attached to the top of the through-contact 64 and lead 19 is attached to ohmic contact 52.

Referring to FIG. 4, the bottom layer 46 of the unitary block 40 is shown on which are disposed the opposite ends of through-contacts 63 and 64 adjacent ohmic contacts 65 and 66, respectively. The bottom portions of the through-contacts 63 and 64 may be part of the same contact as 65 and 66, respectively. The ohmic contact 65 is disposed opposite the rectifying portions 55 and 56 on the top surface of the body 40. The ohmic contact 66 is disposed opposite the ohmic contact 52 on the top surface. The contact portions 63–65 and 64–66 are separated by a groove 53*a* extending through the n-type layer 46 into the nu-type layer 42.

The sectional view of FIG. 3 is taken along a plane running through the n-type portion 56 and shows the disposition of various portions on opposite sides of the block 40. The leads 15, 16, 17 and 19 shown in FIG. 1 are deleted from FIG. 3 for clarity. FIG. 3 also shows that layer 42 has a portion 43 of restricted thickness in that part of the layer disposed between the n-type portions 55 and 56 on the top surface and the ohmic contacts 65 on the bottom surface. The n-type layer 46 is of uniform thickness but conforms to the contour provided by the restricted portion 43 of the layer 42. By means of the restriction 43, the layer 46 is brought closer to the top surface 44 which may be desirable for certain purposes as will be discussed hereinafter.

The above-described individual portions of the unitary body of semiconductor material 40 form a plurality of functional regions each of which is the functional equivalent of one of the conventional elements pictured schematically in FIG. 1. A first transistor region 50, functionally equivalent to the transistor 10, comprises the n-type portion 55 as its emitter, the portion 54 of the top layer 44 located between the grooves 53 is its base and the bottom layer 46 is its collector. The ohmic contacts 55*a*, 57 and 65 serve to make contact to the emitter 55, the base 54 and the collector 46, respectively.

Similarly, a second transistor region 51, functionally equivalent to the transistor 20, comprises the n-type portion 56 as its emitter, the portion 54*a* of the top layer 44 within the etched groves 53 as its base and the bottom n-type layer 46 as its collector. The ohmic contacts 56*a*, 58 and 65 contact the emitter 56, the base 54*a* and the collector 46 of the transistor region 51.

Therefore, a pair of transistor regions 50 and 51 are provided within the unitary block 40. The transistor regions 50 and 51 have separate emitters 55 and 56 and bases 54 and 54*a* but have a common collector 65. The nu-type conductivity layer 42 is also common to both transistor regions and behaves electrically like an intrinsically conductive region in each of the transistors.

An energy storage region 45, which serves as the functional equivalent of the capacitor 30, comprises portions of the layers 42, 44 and 46 and the ohmic contacts 52 and 66 made to layers 44 and 46, respectively. The p-n junction 47 disposed within the energy storage region 45 behaves functionally as a capacitor due to the formation of a depletion layer at the junction 47 when a reverse bias is applied thereacross by means of the conductive leads 17 and 19.

A first resistive region 67, functionally equivalent to the resistor 34, comprises that portion of the seperated portion 54 of the top layer 44 which is disposed between the through-contact 63 and the ohmic contact 57 to the first transistor region 50. A second resistive region 68, functionally equivalent to the resistor 36, comprises the part of the portion 54 of the top layer 44 disposed between the through-contacts 63 and 64.

An electrical signal applied to the input lead 15 is subjected to transistor action in the first transistor region 50 from which an output is derived from the emitter 55 which is connected by means of the conductive connection 61 to the base contact 58 of the second transistor region 51. Here transistor action also occurs producing a signal derived from the emitter contact 56 and carried by the conductive connection 62 to the ohmic contact 52 in the energy storage region 45. The ohmic contact 52 is capacitively coupled to the ohmic contact 66 on the opposite side of the energy storage region 45. The ohmic contact 66 is coupled to the ohmic contact 65 on the collector region of the transistor regions through the through-contact 64, the resistive region 68 and the through-contact 63. The output from the device is derived from the ohmic contact 65 to the transistor collector zone by way of the through-contact 63.

The function of the high resistivity layer 42 is to serve as an isolating medium between the various functional regions so that electrical signals follow a circuit-like path as above-described. It will be noted that the layer 42 is caused to be a passageway of charge carriers in the transistor regions 50 and 51. Also, the high resistive layer 42 is a part of the energy storage region 45. However, the high resistivity layer 42 substantially prevents any current flowing transversely through it between the different functional regions. For example, the formation of a depletion layer at the junction 47 in the energy storage region 45 would ordinarily cause carriers in other parts of the block 40 to be attached to that area since a field would be formed between the areas in which the changes were located and the depletion layer formed by the biasing potential. The use of a high resistivity material for the layer 42 substantially prevents this effect and stray charges are most likely to recombine in the high resistivity layer 42. Other interactions are also substantially reduced because of the high resistivity layer 42.

The device of the type shown in FIGS. 2 through 4 has been made by two principal methods which are applicable in general to monolithic semiconductor devices. First, a combination of diffusion and fusion operations can be performed to provide the desired geometrical pattern. Alternatively, a process has been developed which uses solely diffusion techniques. The latter type of method is preferable for some purposes and the device of FIGS. 2–4 represents a device made by the method. Examples of the formation of the device by both general processes will now be described.

A wafer of silicon having dimensions of approximately 250 x 150 x 4 mils is obtained. The wafer may be cut from a single crystal silicon rod pulled from a melt comprised of silicon and certain impurities which remain therein after refining by floating zone type techniques or the like. The residual impurities amount to about $10^{14}$ impurity atoms per cubic centimeter. Alternatively, the wafer may be a section of a dendritic crystal produced in accordance with the teachings of application Serial No. 844,288, filed October 5, 1959, now Patent 3,031,403, and assigned to the same assignee as the present invention.

As a result of the relatively low impurity level, the resistivity of the material is relatively high and is within the range of from about 100 to 200 ohm-cm. It will be assumed throughout the ensuing discussion that the silicon wafer is of nu-type conductivity. A nu-type conductivity region is one in which conductivity is achieved due to donor type impurities but is distinguished from an n-type region therefrom because of the difference in resistivity. The impurities in the nu-type silicon wafer include those elements in Group V of the Periodic Table such as arsenic and antimony.

There is then diffused onto the silicon wafer gallium vapor in a furnace at about 1200° C. The time of diffusion is controlled so that gallium atoms diffuse into the silicon to a depth of about .4 mil forming a p-type layer, since gallium is an acceptor type impurity, on the external surfaces having a doping level of about $10^{18}$ impurity atoms per cubic centimeter. The diffused layer is then removed from all but the top surface of the wafer by abrasion or lapping. One the side from which the p-type layer has been removed, a layer of a masking material such as a wax or a photoresist material is deposited. Apiezon wax is suitable for such a masking material or a suitable photoresist material is that sold under the trade name KPR by the Eastman Kodak Company. Using well-known techniques, the wax is physically removed, or the photo-resist material is exposed through a pattern which permits, after development the removal of the photoresist material, in 65 of those areas coinciding with the desired location of the collector region 65. Using an etching solution of a mixture of hydrochloric and nitric acids, etching is carried out through the wafer to a desired depth depending upon the desired characteristics of the resulting device. In a typical device etching is continued until the high resistivity region 42 has a thickness of only about .5 to .6 mil in the transistor regions.

The remaining masking material is cleaned off and n-type gold-antimony foils are positioned in those regions where the contacts 63–65 and 64–66 are desired on the bottom surface. The gold-antimony foil consists of about 99.5% gold and 0.5% antimony. On the top surface, foils of a similar n-type alloy are disposed in the positions desired for the emitter portions 55 and 56. Also ohmic contact forming gold-boron foils of about 99% gold and 1% boron are disposed on the top surface in the positions desired for the base contacts 57 and 58, the upper contact 52 of the energy storage region 45 and the top of the through-contacts 63 and 64. Fusion of the foils to the wafer is then carried out at about 700° C. Of course, the fusion of the various foils may be performed in more than one operation, if desired.

Each of the through-contacts 63 and 64 is formed by applying a voltage pulse across opposite sides of the through-contact and breaking down the junction 47 in the material in that region in accordance with the teachings of my copending application Serial No. 38,051, filed June 22, 1960, assigned to the same assignee as the present invention. This technique permits electrical conduction transversely through the wafer. Each through-contact has a resistance of only about 2 or 3 ohms.

The entire wafer is then coated with a wax such as Apiezon wax through which lines are scribed corresponding to the pattern of the desired etch lines 53 on the top surface of the wafer. Etching is then performed through the p-type layer 44 into the high resistivity layer 42.

A two mil gold wire is then bonded to the base contact 57 of the first transistor region 50 for the input lead 15 of the device. Other two mil gold wires are provided for the connecting lead 61 between the emitter 55 of the first transistor region 50 and the base contact 58 of the second transistor region 51 for the connecting lead 62 between the emitter 56 of the second transistor region 51 and the upper contact 52 of the energy storage region 45, for the connecting lead 17 to the upper surface of through-contact 64 and for the lead 16 connected to the upper surface of through-contact 63. The entire structure is then coated with a silicon resin and it may be either encapsulated in plastic material or hermetically sealed within a glass or metallic envelope with the necessary leads 15, 16, 17 and 19 extending therethrough.

It should be noted that the method just described, as it involves some fusion operations, results in a device having minor structural differences from that shown in FIGS. 2–4, which depicts a device made by diffusion operations with no fusion operations. For example, the ohmic contacts **55*a* and 56*a* are not necessary when the emitters 55 and 56 are formed by alloy fusion since the alloy foil used may contain appropriate materials, as is well-known, so as to form both the rectifying junctions 59 and 60 and yet have sufficient surface conductivity to permit application of the conductors 61 and 62 thereto. These conductors 61 and 62 would then be in the form of wires, as just described, rather than a conductive film over an oxide layer as shown. Also, the fusion method does not result in the formation of a continuous n-type layer 46 on the bottom surface of the block but rather forms discrete n-type regions for the collector region 65 and the bottom of the energy storage region 45** which also permit the application of leads thereto without separate ohmic contacts.

It should also be noted that the location of the leads 16 and 17 may be on the bottom surface attached directly to the collector contact 65 and the bottom contact 66 of the energy storage region 45, respectively. For ease in fabrication, all of the leads 15, 16, 17 and 19 are applied to the top surface. This is made possible by use of the through-contacts 63 and 64.

Starting with a high resistivity silicon wafer as in the previously described example, an alternative method may be employed to make the device of FIGS. 2 through 4 having the structural details shown therein. First, by wax coating or photoresist methods, an etched depression is made in the bottom surface of the wafer for location of the ohmic contact 65 to the collector of the transistor regions. Then the entire device is diffused with phosphorus vapor forming a layer of from .5 to 1 mil of n-type material having a surface impurity concentration of about $10^{21}$ atoms per cc. The diffused phosphorus layer is then removed from all but the bottom surface of the wafer by lapping. The entire surface of the wafer is then diffused with gallium vapor, a p-type impurity, resulting in a diffused layer having a surface concentration of $10^{18}$ carriers per cubic centimeter. Since the phosphorus concentration is greater than that of the gallium, the gallium does not alter the conductivity type of the surface on which the phosphorus still remains. The entire surface of the device is then oxidized. Using photoresist techniques again, a pattern is cut through the oxide coating in accordance with the desired n-type emitter regions 55 and 56 on the top surface. Phosphorus is then diffused through the holes in the oxide layer forming a .3 mil thick diffused layer of n-type material leaving about .1 mil in the p-type layer 44 formed by the previous gallium diffusion. Again by wax coating, the necessary etched lines 53 around the portions 54 and **54*a* on the top surface are formed. All surfaces are then again oxidized. By photoresist methods the oxide coating is removed except where it is desired to form a connective layer 61 between the emitter 55 of the first transistor and the base 58 of the second transistor and a connection 62 between the emitter 56 of the second transistor and the upper contact 52 of the energy storage region. Here portions 61*a* and 62*a* are left to provide electrical insulation between the conductive connections 61 and 62, respectively, and the semiconductive portions 54 and 54*a*. A second pattern is formed by photoresist methods and aluminum vapor is diffused to form ohmic contacts to the bases 57 and 58, the emitters 55 and 56 and the upper contact 52 of the energy storage region 45 as well as the just mentioned connections 61 and 62. On the bottom surface of the wafer the same techniques are used to form the ohmic contact to the collector region 65 and the lower contact 66 of the energy storage region 45**.

The through-contacts 63 and 64 and the wire contacts for the input, output and bias terminals are then formed as in the previous example.

The amplifier device just previously described may, by slight modification in fabrication, be formed as either a video or an audio amplifier by varying the base region of the transistor regions, that is the portion of layer 44 which is included in the transistor regions 50 and 51. It is believed that the minority carrier transit time in the base region 44 of the transistor regions 50 and 51 determines to a large extent the gain and frequency response of the device. The minority carrier transit time may be controlled within certain limits by the thickness of the base and the impurity concentration. For an audio amplifier the p-type layer 44 between the emitters 55 and 56 and the p-n junction 47 is made to be for example, about 0.2 mil in thickness. Also, the doping of the base region is at a relatively low average level of about $10^{15}$ atoms per cubic centimeter. To provide a video amplifier having a good frequency response up to several megacycles the base thickness may be set at 0.1 mil with an average impurity concentration of $10^{16}$ atoms per cubic centimeter. While the gain may be desired to be at a higher level, it is found that to obtain good frequency response some sacrifice in gain must be made.

With devices such as that shown, current gains of up to 2000 have been obtained in audio amplifier and power gains of better than 30 db have been obtained out to 3 megacycles for video amplifier. The input and output impedances of the device may be widely varied depending on the manner of fabrication and dimensions used. Typical values are an input impedance of about 10,000 ohms and an output impedance of about 2000 ohms.

By starting with a wafer of high resistivity semiconductive material and by forming thereon various regions which actually perform the desired device operation a plurality of devices may be formed in addition to that just described embodying circuits of various types and for various purposes.

Figure 5:
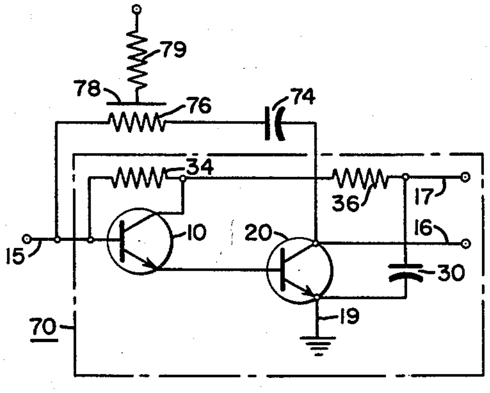
FIG. 5 is a schematic of the equivalent circuit of an alternative embodiment of applicant's invention.
Figure 6:
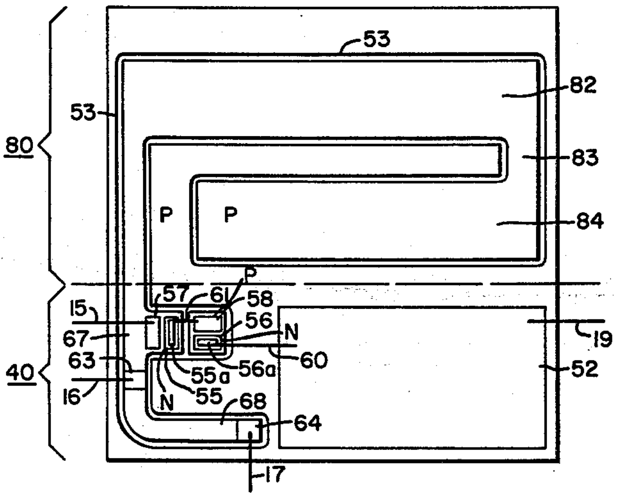
FIGS. 6 and 7 are the top and bottom views, respectively, of a monolithic semiconductor device embodying the circuit of FIG. 5.
Figure 7:
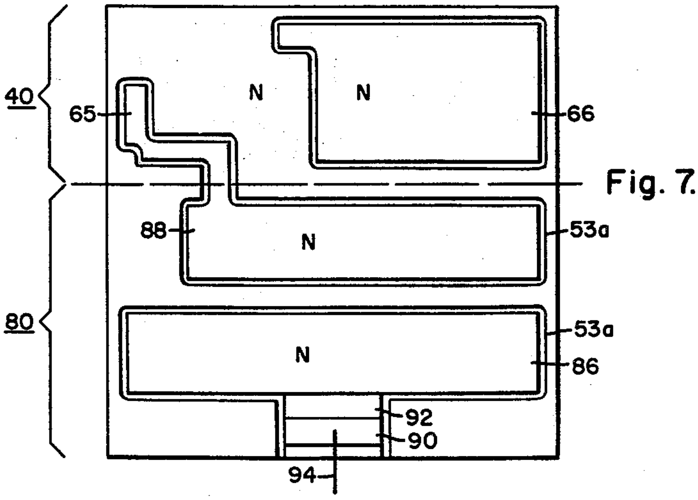

Referring now to FIG. 5 there is shown a circuit diagram in accordance with that shown in FIG. 1 but having in addition thereto an RC filter circuit providing tuning for the amplifier. In accordance with copending application Serial No. 5,045, filed January 27, 1960, by W. M. Kaufman and assigned to the same assignee as the present invention, there is provided within a monolithic semiconductive device a narrow band rejection filter or a notch filter performing the tuning function of the RC filter portion of the circuit of FIG. 5. FIGS. 6 and 7 show a monolithic semiconductive device comprising the circuit shown in FIG. 5.

The circuit of FIG. 5 includes within the dotted line a circuit portion 70 which is substantially the same as that shown in FIG. 1. In addition, there is connected across the input and output terminals 15 and 16 of the circuit portion 70 an additional circuit portion representing a distributed bridge T-filter providing a notched filter characteristic. This circuit portion comprises a capacitor 74 coupled to a distributed resistance 76 which is in capacitive relationship to a conductor 78 to which a tuning signal may be applied through a resistor 79. The resistance 76 and the conductor 78 form a distributed capacitor.

Referring now to FIGS. 6 and 7, the circuit of FIG. 5 is shown in a monolithic structure. The entire structure has as its general structure a center nu-type layer 42, a top p-type layer 44 and a bottom n-type layer 46 like those shown in FIGS. 2 and 3. Portion 40 represents that which was described in connection with FIGS. 2 through 4. A filter portion 80 is joined with the portion 40 and together formed a unitary block. On the upper surface of the device there are formed resistive regions 82 and 84 connected to the portion 67 which may be formed in the same manner as the portion 67 by separation from the p-type layer 44 by grooves 53. On the lower surface ohmic contacts 86, 88 and 90 are applied to the n-type layer 46 in the same manner as those to the regions 65 and 66 in the pattern shown. Etched grooves 53*a*, which extend through the n-type layer 46 into the nu-type layer 42, separate the n-type portion 86 from the portion having contacts 86 and 90 thereon. An n-type connecting portion 92 joins the areas to which the contacts 86 and 90 are applied. As is the case with the device of FIGS. 2–4, each region of the filter portion 80 of the monolithic device is the functional equivalent of a circuit element shown in FIG. 5. The functional equivalent of the capacitor 74 is provided by an energy storage region comprising the opposing portions 84 and 88 to which a reverse bias is supplied. The resistive element 76 has its functional equivalent in the p-type portion 82, directly connected to the portion 84 by the portion 83, and which is opposed on the opposite side of the block by the contact 86 thereby forming a distributed capacitor. The n-type portion 92 is the functional equivalent of the resistor 79 through which the tuning signal is applied at the ohmic contact 90 by means of the lead in 94. The manner of operation of this device is discussed in greater detail in the referred to copending application Serial No. 5,045.

While the present invention has been shown in only certain forms, it will be obvious to those skilled in the art that it is not so limited but is susceptible to various changes and modifications without departing from the spirit and scope thereof.

I claim as my invention:

1. A solid-state amplifier device comprising a unitary body of semiconductor material including a continuous layer of a material having a resistivity of at least 50 ohm-centimeters, second and third layers of opposite conductivity type material disposed on opposite sides of said continuous layer, said second layer forming a rectifying junction with said continuous layer, said second and third layers each comprised of a plurality of discrete portions of which a first portion of said third layer is opposed by first and second portions of said second layer and a second portion of said third layer is opposed by a third portion of said second layer, said first and second portions of said second layer each having a region of opposite conductivity type thereon remote from said continuous layer comprising first and second emitter regions, said first and second portions of said second layer comprising first and second base regions, said first portion of said third layer comprising a common collector region, said second portion of said third layer and said third portion of said second layer comprising an energy storage region capable of functioning as a capacitor, first means to conductively interconnect said first emitter region and said second base region; and second means to conductively interconnect said second emitter region and said third portion of said second layer.

2. A solid-state amplifier device comprising a unitary body of semiconductor material including a continuous layer of a high resistivity material, second and third layers of opposite conductivity type material disposed on opposite sides of said continuous layer and having appreciably lower resistivity than said continuous layer, said second layer forming a rectifying junction with said continuous layer, said second and third layers each comprised of a plurality of discrete portions of which a first portion of said third layer is opposed by first and second portions of said second layer and a second portion of said third layer is opposed by a third portion of said second layer, said first and second portions of said second layer each having a region of opposite conductivity type thereon remote from said continuous layer comprising first and second emitter regions, said first and second portions of said second layer comprising first and second base regions, said first portion of said third layer comprising a common collector region, said first portion of said second layer also comprising first and second resistive regions, said second portion of said third layer and said third portion of said second layer comprising an energy storage region capable of functioning as a capacitor, a first conductive member electrically coupling said first emitter region to said second base region, a second conductive member electrically coupling said second emitter region to said third portion of said second layer, an input lead connected to said first base region, an output lead connected to said first portion of said second layer between said first and second resistive regions, a first low resistance path between said output lead and said collector region, a first bias lead connected to said first portion of said second layer at the extremity of said resistive regions remote from the position of said first emitter region, a second low resistance path between said first bias lead and said second portion of said third layer and a second bias lead connected to said third portion of said second layer.

3. A solid state tuned amplifier device comprising a unitary body of semiconductor material including a continuous layer of a high resistivity material, second and third layers of opposite conductivity type material disposed on opposite sides of said continuous layer and having appreciably lower resistivity than said continuous layer, said second layer forming a rectifying junction with said continuous layer, said second and third layers each comprised of a plurality of discrete portions of which a first portion of said second layer is opposed by first and second portions of said third layer, a second portion of said second layer is opposed by said first portion of said third layer and a third portion of said second layer is opposed by a third portion of said third layer, said first and second portions of said second layer each having a region of opposite conductivity type thereon remote from said continuous layer comprising first and second emitter regions, said first and second portions of said second layer comprising first and second base regions, said first portion of said third layer comprising a common collector region, said first portion of said second layer also comprising first, second, third and fourth interconnected regions, said third region opposed by said second portion of said third layer and said fourth region opposed by said first portion of said third layer, a first conductive member electrically coupling said first emitter region to said second base region, a second conductive member electrically coupling said second emitter region to said third portion of said second layer, an input lead connected to said first base region, an output lead connected to said first portion of said second layer between said first and second regions thereof, a first low resistance path between said output lead and said collector region, a first bias lead connected to said first portion of said second layer at the extremity of said first and second regions remote from said first emitter region, a second low resistance path between said first bias lead and said third portion of said third layer, a second bias lead connected to said third portion of said second layer and a tuning signal input lead connected to said second portion of said third layer at a point thereon not opposed by said third region of said first portion of said second layer.

4. In a semiconductor device capable of performing the functions of a plurality of individually interconnected conventional components, the structure comprising, within a unitary body of semiconductive material: emitter, base and collector regions of alternate semiconductivity types cooperatively associated to provide the functions of a junction transistor; first and second diode regions of opposite semiconductivity type cooperatively associated to provide the functions of a p-n junction diode; means to reverse bias said diode so that it performs capacitor functions; and a high resistivity region having a resistivity of at least 50 ohm-centimeters which resistivity is appreciably higher than any of said emitter, base, collector and diode regions; said high resistivity region extending between said base and collector regions and also extending between said diode regions to maintain all of said regions in a physical unit and also to electrically isolate said first and second diode regions from said emitter, base and collector regions by reason of its relatively high resistivity.

5. In a semiconductor device capable of performing the functions of a plurality of individually interconnected conventional components, the structure comprising: a unitary body of semiconductive silicon material having opposing major surfaces, said body having a bulk material of a first semiconductivity type; a top layer of semiconductive material of a second semiconductivity type on one of said major surfaces but separated into a plurality of discrete portions all of which form a p-n junction with said bulk material; a bottom layer of semiconductive material of said first semiconductivity type and also separated into a plurality of discrete portions; said bulk material having a resistivity appreciably higher than that of said top and bottom layers; a first of said discrete portions of said top layer serving as a transistor base region and having disposed thereon an ohmic base contact and a region of said first type semiconductivity serving as an emitter region, said emitter region having an ohmic emitter contact disposed thereon; a first of said discrete portions of said bottom layer serving as a transistor collector region and having an ohmic collector contact disposed thereon; said collector region being disposed opposite said base region with a portion of said bulk material therebetween; a second of said discrete portions of said top layer serving as a first region of a diode; a second of said discrete portions of said bottom layer serving as a second diode region of said diode disposed opposite said first diode region with a portion of said bulk material therebetween; first and second ohmic capacitor contacts on said first and second diode regions respectively; means to apply a potential to said first and second ohmic capacitor contacts to reverse bias said diode so that it performs capacitor functions; said bulk material serving to maintain in a physical unit said emitter, base, collector and diode regions and also to electrically isolate said first and second diode regions from said emitter, base and collector regions by reason of its relatively high resistivity.

References Cited by the Examiner

UNITED STATES PATENTS

| | | | |
|---|---|---|---|
| 2,811,653 | 10/57 | Moore | 317—235 X |
| 2,816,228 | 12/57 | Johnson | 330—38 X |
| 2,820,154 | 1/58 | Kurshan | 330—37 |
| 2,870,050 | 1/59 | Mueller et al. | 317—235 |
| 2,898,454 | 8/59 | Loughlin | 330—38 |
| 3,008,089 | 11/61 | Uhlir | 307—88.5 X |
| 3,022,568 | 2/62 | Nelson et al. | 317—235 X |
| 3,070,762 | 12/62 | Evans | 330—38 X |
| 3,110,870 | 11/63 | Ziffer | 307—88.5 |
| 3,115,581 | 12/63 | Kilby | 330—38 X |

FOREIGN PATENTS

| | | |
|---|---|---|
| 665,867 | 1/52 | Great Britain. |

NATHAN KAUFMAN, *Acting Primary Examiner.*

BENNETT G. MILLER, JOHN KOMINSKI, *Examiners.*